April 11, 1961 D. A. JENNY ET AL 2,979,428

SEMICONDUCTOR DEVICES AND METHODS OF MAKING THEM

Filed April 11, 1957

INVENTORS
DIETRICH A. JENNY &
JOSEPH J. WYSOCKI

BY J. L. Whittaker

ATTORNEY

United States Patent Office 2,979,428

Patented Apr. 11, 1961

2,979,428

SEMICONDUCTOR DEVICES AND METHODS OF MAKING THEM

Dietrich A. Jenny and Joseph J. Wysocki, Princeton, N.J., assignors to Radio Corporation of America, a corporation of Delaware Filed Apr. 11, 1957, Ser. No. 652,280

7 Claims. (Cl. 148—1.5)

This invention relates to improved semiconductor devices. More particularly, the invention relates to improved devices utilizing compound semiconductive materials, and to improved methods of making such devices.

In the art of making semiconductor circuit elements such as transistors, the semiconductive materials most often used are elemental germanium and silicon. Certain binary solid compounds also exhibit useful semiconductive properties. Examples are the phosphides, arsenides, and antimonides of aluminum, gallium, and indium. These materials are known as III–V compounds because they are made of one element from the third column and one element from the fifth column of the periodic table. Such compounds have certain advantages over conventional materials such as silicon and germanium. The mobility of negative charge carriers is usually much greater in most of these compounds than in germanium or silicon. However, it has been found difficult to fabricate satisfactory devices such as diodes and transistors of these compound materials. One of the problems in the manufacture of semiconductor devices utilizing III–V compounds is the difficulty of making good ohmic contacts for non-rectifying electrodes on the compound semiconductor wafers.

An object of this invention is to provide improved semiconductive devices utilizing compound semiconductors.

Another object of this invention is to provide improved semiconductor circuit elements utilizing III–V compounds.

A further object is to provide improved methods of fabricating III–V compound semiconductor devices.

Still another object of this invention is to provide improved ohmic contacts for semiconductive devices made of III–V compounds.

A further object is to provide improved methods of effecting ohmic (non-rectifying) contacts to III–V compound semiconductor bodies.

Yet another object of this invention is to provide an improved type of transistor having improved non-rectifying electrodes.

These and other objects of the invention are accomplished by alloying a pellet of electrode material selected from the group consisting of aluminum, gallium, indium, and lead to a surface of a monocrystalline semiconductive binary III–V compound wafer of either conductivity type. It has unexpectedly been found that the elements aluminum, gallium, and indium, which are constituents of the III–V compounds, make excellent ohmic contacts to wafers of these materials regardless of the conductivity type of the particular wafer. It has also been found that lead acts in a similar manner.

The invention and its advantages will be described in greater detail with reference to the accompanying drawing in which.

Similar reference characters are applied to similar elements throughout the drawing.

Figure 1:
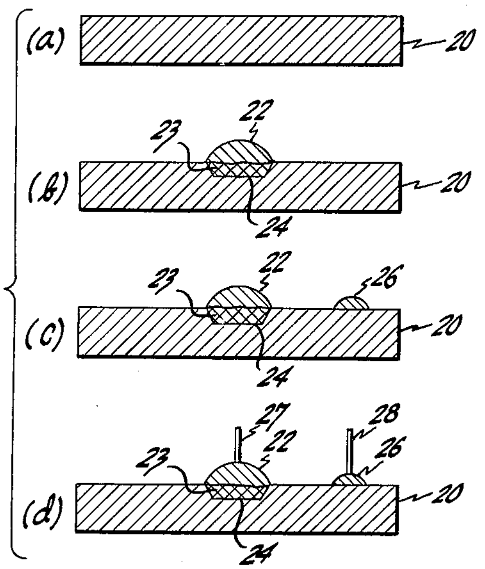
Figures 1A–1D are cross-sectional schematic views of successive steps in the fabrication of a diode having the feature hereinbefore mentioned.

Referring to Figure 1A of the drawing, a semiconductor body 20 is prepared as a wafer of a monocrystalline semiconductive compound selected from the phosphides, arsenides, and antimonides of aluminum, gallium, and indium. The semiconductor body may be of either conductivity type. In this example, the material used is gallium arsenide of N-conductivity type. The size of the wafer is not critical. A suitable wafer may be about 100 mils square and about 10 mils thick.

Referring to Figure 1B, a rectifying electrode is made to the wafer 20 by alloying to one face of the wafer a pellet 22 of material that induces conductivity of type opposite to that of the wafer. Since the wafer of starting material in this example is of N-conductivity type, the material selected for the electrode pellet 22 must be one which induces P-conductivity type in gallium arsenide. Zinc, cadmium, and mercury are suitable materials for inducing P-type conductivity in gallium arsenide and the other III–V compounds. In this example, the electrode pellet 22 consists of cadmium. The pellet 22 may be in the form of a small disc, or a spherule known as a dot. The cadmium dot is alloyed to a wafer face by contacting the dot to the wafer and heating the assembly to about 500° C. for about 15 minutes. Preferably, the heating is performed in an inert atmosphere, to avoid oxidation of the materials. The cadmium dot 22 melts, and dissolves the portion 23 of the wafer which is just below the electrode pellet 22. The recrystallized region 23 is converted to P-conductivity type. At the interface 24 between the P-type region 23 and the N-type bulk of the wafer 20, a rectifying barrier known as a P–N junction is formed. The surface of the wafer 20 may then be cleaned by immersing the wafer in an etchant. A suitable etchant for the semiconductive III–V compounds is composed of equal volumes of concentrated nitric acid and concentrated hydrochloric acid.

Referring to Figure 1C, a non-rectifying electrode is fabricated by alloying or fusing to a surface of the wafer 20 a pellet 26 of material selected from the group consisting of aluminum, indium, gallium, and lead. In this example, the pellet 26 consists of indium. The pellet 26 is contacted to the wafer surface, and the assembly is heated to about 500° C. for about 15 minutes. The contact thus formed between the indium pellet 26 and the N-type gallium arsenide wafer 20 is ohmic in character. This result is contrary to the well-known production of non-ohmic rectifying contacts by indium pellets surface alloyed to N-type wafers of germanium or silicon.

Referring to Figure 1D, the device is completed by attaching electrical leads 27 and 28 to the rectifying electrode 22 and the non-rectifying electrode 26 respectively. The unit is subsequently mounted and cased by conventional techniques known in the art.

The resulting diodes have the advantage of operating successfully at higher temperatures than conventional units using germanium or silicon as the semiconductive material. Semiconductor devices are limited as to operating temperatures because a hot device has sufficient thermal energy to raise substantial numbers of electrons across the energy gap between the valence band and the conduction band, thus adversely affecting the performance parameters of the unit. The greater the energy gap of the semiconductor used, the higher the temperature at which the device can operate. However, if the energy gap of a semiconductor becomes too large, the material becomes similar to an insulator in its properties, and is difficult to use for devices such as transistors.

The energy gap of germanium is about 0.7 electron volt, and most germanium semiconductive devices become inoperative above 80° C. Silicon semiconductive devices can be successfully operated at higher ambient or dissipation temperatures, as silicon has an energy gap estimated at about 1.1 electron volts. The III–V compounds mentioned above are useful because they have energy gaps greater than that of germanium or silicon, but still within the range of usefulness of a semiconductor. Gallium arsenide, which has been mentioned as a representative III–V compound, has an energy gap of 1.35 electron volts. Devices of this class utilizing gallium arsenide as the semiconductor can be operated at temperatures as high as 300° C. The estimated magnitude of the energy gap in some of the other III–V compounds is as follows: gallium phosphide, 2.4 electron volts; aluminum arsenide, 2.4 electron volts; aluminum antimonide, 1.6 electron volts; indium phosphide, 1.25 electron volts.

Figure 2:
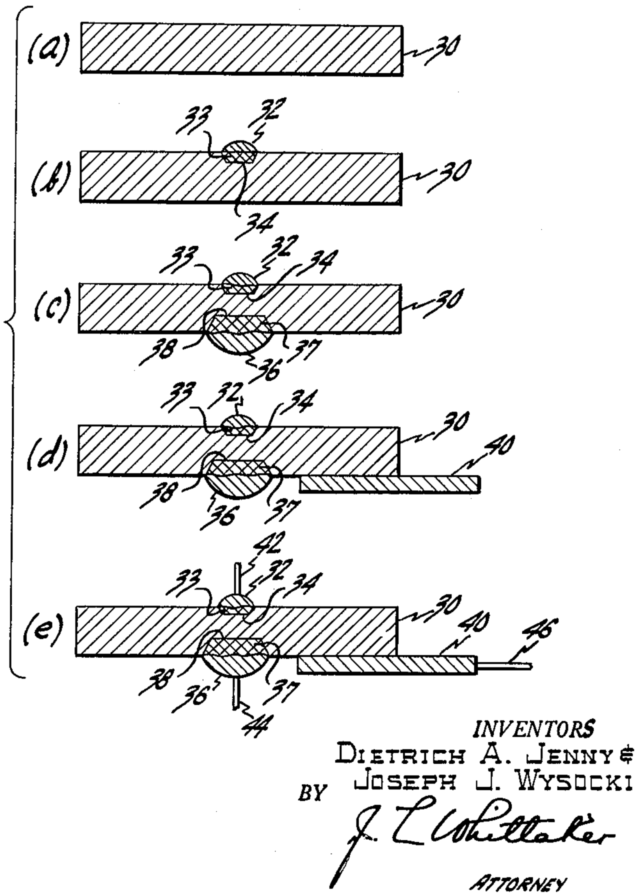
Figures 2A–2E are cross-sectional schematic views of successive steps in the fabrication of a transistor according to another embodiment of the invention.

In addition to diodes, improved triodes of the transistor type may be made by the method of this invention. Referring to Figure 2A, a semiconductor body 30 is prepared as a wafer of a monocrystalline semiconductive compound selected from the phosphides, arsenides, and antimonides of aluminum, gallium, and indium. The wafer may be of either conductivity type. In this example, the material used is P-conductivity type gallium arsenide. The size of the wafer is not critical, and may be similar to that of the diode described in connection with Figure 1.

Referring to Figure 2B, a rectifying electrode is made by alloying to one major face of the wafer a pellet 32 of material that induces conductivity of opposite type to that of the wafer. Since this wafer of starting material is of P-conductivity type, the impurity material selected must induce N-conductivity type in gallium arsenide. Suitable impurity materials for this purpose include sulfur, selenium, and tellurium. In this example, the electrode pellet 32 consists of tellurium. The tellurium dot is alloyed to one major face of the wafer 30 by contacting the dot to the wafer and heating the assembly to about 600° C. for about 15 minutes. The alloying step is preferably performed in an inert atmosphere. The tellurium penetrates a region 33 of the wafer which is immediately below the electrode pellet 32. The region 33 is converted to N-conductivity type, since tellurium is a donor in gallium arsenide. A rectifying barrier 34 is formed at the interface of the N-type region 33 and the P-type bulk of the wafer 30.

Referring to Figure 2C, a second rectifying barrier is formed in the wafer 30 by similarly alloying another tellurium electrode pellet 36 to the opposite major face of the wafer 30. The pellet 36 is preferably coaxially aligned with the first electrode 32. In surface alloyed transistors of the class shown, having two electrodes aligned on opposite sides of a semiconductor wafer, it has been found advantageous to make one electrode larger than the other, and utilize the smaller electrode as the emitter, while the larger electrode is made the collector. In this example, the second electrode pellet 36 is larger than the first electrode pellet 32. The wafer region 37 adjacent the pellet 36 is converted to N-conductivity type. A P–N junction 38 is formed at the interface of the N-type region 37 and the P-type bulk of the wafer 30.

Referring to Figure 2D, a base tab 40 is soldered to a surface of the wafer 30. The connection between the base tab 40 and the gallium arsenide wafer 30 must be ohmic in character. According to this invention, suitable materials for this purpose are aluminum, gallium, indium, and lead. In this example the base tab 40 consists of aluminum-coated nickel. The tab 40 is attached to the wafer 30 by heating the assembly to about 700° C., so that the aluminum melts. The firing step is performed in vacuum, with pressure applied to the wafer, in order to break the film of aluminum oxide on the aluminum, and thus promote efficient wetting. The molten aluminum acts as an ohmic solder between the tab and the wafer. Alternatively, the firing may be performed in an inert atmosphere, using Alcoa Flux 33.

Referring to Figure 2E, the transistor is completed by first cleaning the wafer surface in the etchant described above, and then attaching leads 42, 44 and 46 to the emitter 32, the collector 36, and the base tab 40 respectively.

Although the above embodiments of the invention have been described in terms of gallium arsenide as the semiconductive material, it will be understood that gallium arsenide has been mentioned as a representative example of the compounds which may be used, and not as a limitation. The invention may be practiced with all the other III–V compounds, such as gallium phosphide, aluminum arsenide, aluminum antimonide, and indium phosphide. Other semiconductive devices may be made by the method of this invention from these materials, each device having at least two regions of opposite conductivity type separated by a rectifying P–N junction, and at least one non-rectifying ohmic electrode selected from the group consisting of aluminum, indium, gallium, and lead.

Some of the III–V compounds as normally made by direct synthesis of the elements are of N-conductivity type, such as gallium arsenide and indium phosphide. Others are normally of P-conductivity type, such as gallium antimonide. It is believed that the particular conductivity type formed depends on the kind and amount of impurities present.

It will be understood that analogous devices can be made beginning with wafers of either conductivity type. Applicants have discovered that N-type III–V compounds can be doped with zinc, cadmium, or mercury to become P-type, while the P-type materials of this group can be doped with selenium, sulfur, or tellurium to become N-type.

As mentioned above, the device made in accordance with the instant invention may be successfully operated at ambient temperatures considerably higher than the limiting operating temperatures for germanium and silicon units. Ohmic electrodes made of indium in accordance with the instant invention have been found useful for applications up to about 150° C. Ohmic contacts made of lead in accordance with the instant invention may be employed for devices intended to operate up to about 300° C. For the temperature range up to about 600° C., non-rectifying electrodes made of aluminum in accordance with the instant invention may be utilized.

Devices of the type described above have other advantages besides the ability to operate at elevated temperatures. An important semiconductor parameter is the mobility of charge carriers in the material. High mobility is particularly desirable for the minority charge carriers in devices such as transistors. The mobility of negative charge carriers (electrons) in germanium is about 3900 cm.$^2$/volt sec. The mobility of electrons in silicon is smaller, being about 1500 cm.$^2$/volt sec. Some of the III–V compounds mentioned have considerably higher mobilities. For example, the mobility of electrons in indium phosphide is at least 3500 cm.$^2$/volt sec.; in indium arsenide, about 23000 cm.$^2$/volt sec.; in indium antimonide, about 65000 cm.$^2$/volt sec. Gallium arsenide, which has been mentioned as a representative example of the compound semiconductors, has an electron mobility of at least 4500 cm.$^2$/volt sec., and thus unites the advantages of a charge carrier mobility greater than that of germanium with the advantages of an energy gap greater than that of silicon. Semiconductors with high electron mobility are particularly suitable for N–P–N devices of the type described in connection with Figure 2.

There have thus been described new and useful forms of semiconductor devices, as well as methods for making these devices.

What is claimed is:

1. A circuit element comprising a body of semiconductive gallium arsenide, said body having at least one rectifying electrode attached thereto, and at least one ohmic electrode fused to said body, said ohmic electrode consisting of indium.

2. A circuit element comprising a body of semiconductive gallium arsenide, said body having at least one N-type region separated from a P-type region by a rectifying barrier, and at least one ohmic electrode fused to said body, said ohmic electrode consisting of indium.

3. A circuit element comprising a body of semiconductive gallium arsenide, said body having at least two regions of given conductivity type and one region of opposite conductivity type separated from said two regions by rectifying barriers, and at least one non-rectifying electrode surface alloyed to said body, said electrode consisting of indium.

4. A junction type semiconductor device including a semiconductive gallium arsenide wafer, said wafer containing at least one rectifying barrier, and at least one ohmic contact to said wafer, said contact comprising a surface alloyed pellet of indium.

5. A semiconductor device including a non-rectifying electrode composed of indium, said electrode being fused to a body of given conducivity type gallium arsenide.

6. In the method of making semiconductor devices comprising the steps of forming at least one rectifying barrier in a monocrystalline wafer of semiconductive gallium arsenide, and making an ohmic contact to a portion of said wafer, the improvement comprising fabricating said ohmic contact by alloying a pellet of indium to a selected portion of the surface of said wafer.

7. The method of making a non-rectifying contact to a body of semiconductive gallium arsenide, comprising contacting said body with a quantity of indium, and heating said body and said indium in an inert atmosphere to a temperature above the melting point of indium but below the melting point of gallium arsenide.

References Cited in the file of this patent

UNITED STATES PATENTS

| | | |
|---|---|---|
| 2,759,861 | Collins | Aug. 21, 1956 |
| 2,798,013 | Irmler | July 2, 1957 |
| 2,805,370 | Wilson | Sept. 3, 1957 |
| 2,825,667 | Mueller | Mar. 4, 1958 |
| 2,847,335 | Gremmelmaier et al. | Aug. 12, 1958 |

FOREIGN PATENTS

| | | |
|---|---|---|
| 731,370 | Great Britain | June 1, 1955 |